United States Patent [19]

Moxon

[11] Patent Number: 4,503,484

[45] Date of Patent: Mar. 5, 1985

[54] CHASSIS FOR ELECTRONIC CIRCUITRY

[75] Inventor: Edwin C. Moxon, Boxboro, Mass.

[73] Assignee: Stypher Corporation, Hudson, Mass.

[21] Appl. No.: 546,209

[22] Filed: Oct. 28, 1983

[51] Int. Cl.³ ............................................. H05K 1/14
[52] U.S. Cl. .................................. 361/395; 361/383;
361/394; 361/412; 339/17 M
[58] Field of Search ........ 361/380, 382, 383, 393–396,
361/398, 399, 412, 413, 415, 422, 424, 429;
174/51; 339/17 F, 17 LM, 17 M, 17 N; 211/41

[56] References Cited

U.S. PATENT DOCUMENTS

| | | | |
|---|---|---|---|
| 2,792,111 | 5/1957 | Ringler | 206/65 |
| 2,839,188 | 6/1958 | Cipriani | 206/79 |
| 2,907,926 | 10/1959 | Slack | 361/395 |
| 3,048,268 | 8/1962 | Rocchi | 206/65 |
| 3,258,649 | 6/1966 | Arguin | 361/386 |
| 3,349,481 | 10/1967 | Karp | 29/627 |
| 3,377,515 | 4/1968 | Erb | 361/415 |
| 3,382,476 | 5/1968 | Novet | 361/415 |
| 3,476,982 | 11/1969 | Bell | 361/415 |
| 3,476,983 | 11/1969 | De Robertis | 361/415 |
| 3,558,852 | 6/1971 | McCormack | 361/412 |
| 3,596,140 | 7/1971 | Walsh | 361/412 |
| 3,639,809 | 2/1972 | Phlieger, Jr. | 220/5 R |
| 3,675,299 | 7/1972 | Sherrill, Jr. | 339/176 MP |
| 3,704,394 | 11/1972 | Johnson | 339/17 M |
| 3,742,309 | 6/1973 | Sterner | 361/413 |
| 4,109,788 | 8/1978 | Hirose | 206/329 |
| 4,164,362 | 8/1979 | Cobaugh | 339/17 M |
| 4,220,384 | 9/1980 | Clark | 339/59 M |
| 4,250,536 | 2/1981 | Barringer | 361/413 |
| 4,254,446 | 3/1981 | Peoples | 361/383 |
| 4,382,517 | 5/1983 | Welsch | 361/415 |
| 4,430,691 | 2/1984 | Rea | 361/383 |

Primary Examiner—G. P. Tolin
Attorney, Agent, or Firm—Wolf, Greenfield & Sacks

[57] ABSTRACT

A chassis for electronic circuit modules is disclosed in which a support frame is fabricated from two flat side panels spaced apart by four rods. The rods may be of variable length to accomodate various chassis widths. Each electronic circuit module is comprised of the printed circuit board or boards on which the circuit components, including switches, indicator lights and connectors are mounted, a front panel with cutouts for the lights or switches and a back panel with cutouts for the connectors. The front panel and the back panel are mounted perpendicularly on the ends of the printed circuit boards with the lights and connectors protruding through at appropriate locations. Each of the printed circuit boards has four slots which engage the four rods so that, when the modules are placed in the frame and the rods are in place, the modules are rigidly locked together to form a unit. The package is completed by removable top and bottom panels which are held by clips onto the rods. Power and ground and data signals are conveyed between the modules by means of an internal cable which connects the modules in parallel so that only connections with external circuitry need be made through the back panel connectors.

29 Claims, 9 Drawing Figures

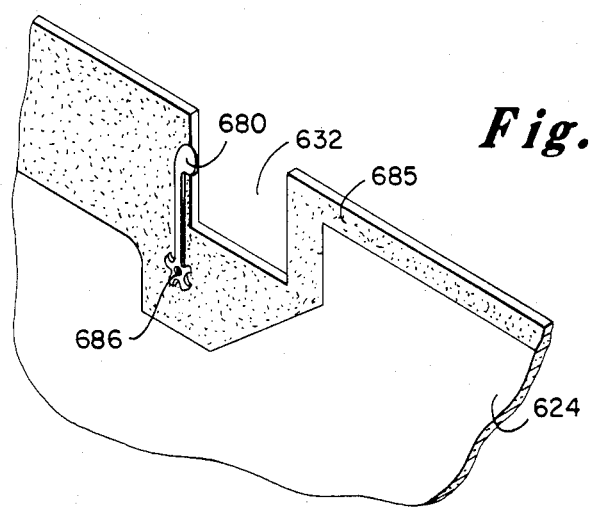
Fig.6
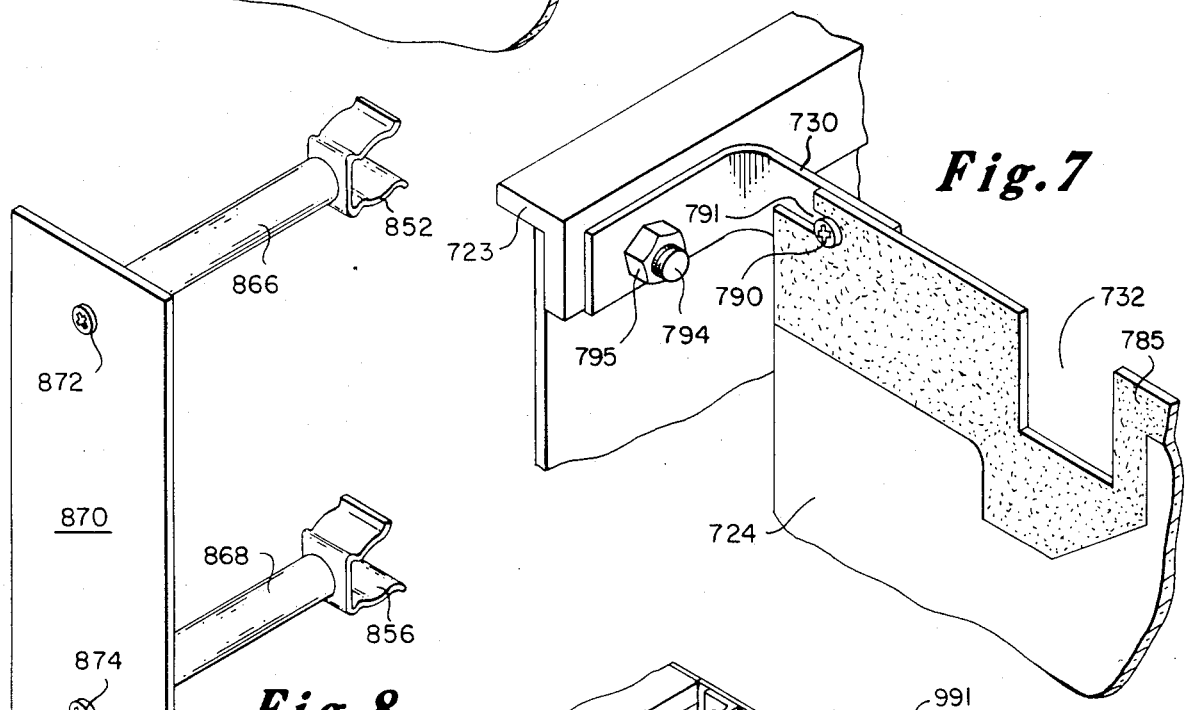
Fig.7
Fig.8
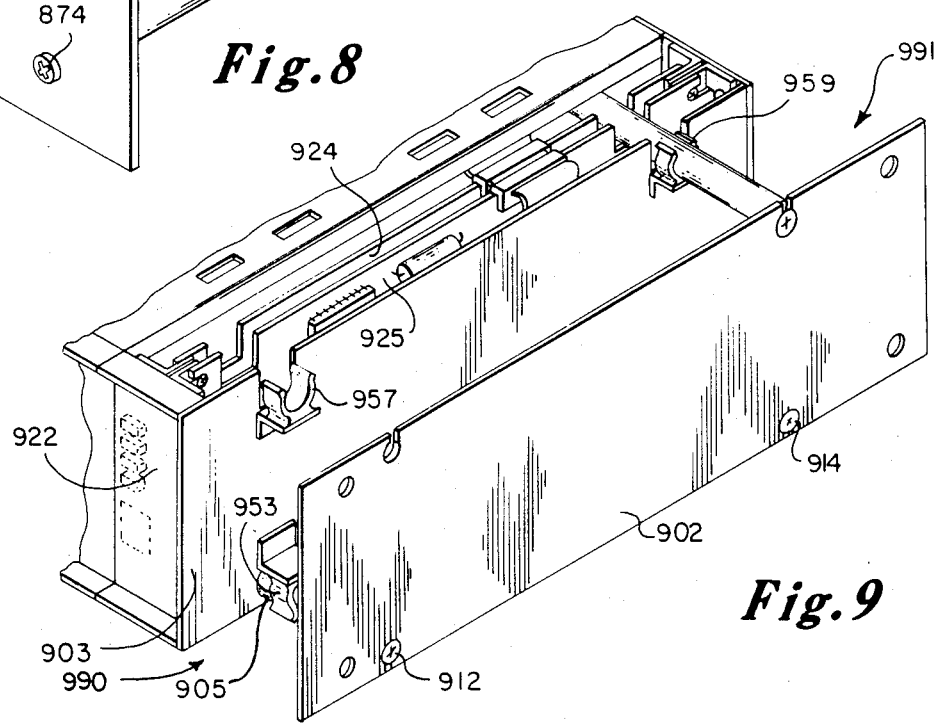
Fig.9

CHASSIS FOR ELECTRONIC CIRCUITRY

FIELD OF THE INVENTION

This invention relates to modular packages for housing electronic circuits.

BACKGROUND OF THE INVENTION

In the television field, electronic systems often use a plurality of circuit modules each of which performs a particular function, which modules are connected together to form a system. Since the function performed by a particular module is often a standardized function, used throughout the television industry, many manufacturers of television equipment sell "standard" modules for performing these standard functions.

From the standpoint of appearance, shielding from electromagnetic interference and physical protection, the circuit modules connected together to form a system must be enclosed in a metal box. However, this presents a problem because the arrangement and grouping of the modules for each customer is different.

One prior art approach is to manufacture a sheet metal box designed specifically for each customer configuration and permanently wire the modules together to provide power, ground and data signal paths. This approach involves substantial cost because a large number of different box configurations must be kept in stock to accomodate various customer configurations.

Another prior art approach to this problem has been to use a mainframe/plug-in approach. In this approach, a mainframe, backplane or "motherboard" is manufactured in a standard box or cabinet with a plurality of receptacles or "slots" each of which can accept various circuit modules. The motherboard provides each module with power, ground, signal input and signal output leads and can be customized for each customer by inserting different sets of modules. There are several problems with this approach. One problem is that the motherboard and its cabinet must contain room for several circuit modules in order to allow for system expansion so that the unit can be used for many customers. A customer who needs only a few circuit modules must still purchase the entire motherboard assembly thus incurring an increased costs and wasting valuable space.

Another problem with the motherboard approach is that each of the circuit modules must have a connector configuration which is fixed in order to match the connector configuration on the motherboard so that the module can be plugged into a particular slot. The fixed connector configuration often constrains the design of the module circuitry. In addition, the motherboard approach often requires that there be two sets of connectors—one between the circuit module and the motherboard and another connector set between the motherboard and external circuitry. The duplicate set of connectors increase cost and inject additional noise and signal problems into the system.

It is therefore an object of the present invention to provide an electronic circuit chassis which can house electronic circuit modules in various configurations without requiring a box of any type.

It is another object of the present invention to provide an electronic circuit chassis which can house electronic circuit modules in various configurations without requiring a back-plane unit or motherboard to provide distribution of power and data signals.

It is yet another object of the present invention to provide an electronic circuit chassis which uses a standard array of mechanical pieces which can be readily stocked and assembled to provide systems with various groupings and configurations.

It is still another object of the present invention to provide an electronic circuit chassis which can be quickly and readily assembled from the standard parts without requiring special tools or machinery.

It is a further object of the present invention to provide an electronic circuit chassis which when assembled has a neat and finished appearance.

It is yet a further object of the present invention to provide an electronic circuit package which does not require the use of motherboards, mainframes or backplanes to provide power, ground and signal connections to the circuit modules.

SUMMARY OF THE INVENTION

The foregoing objects are achieved and the foregoing problems are solved in one illustrative embodiment of the invention in which a variable width support frame is constructed from two flat side plates and a plurality of electrically conductive rods of equal length. The rods may have varying length to assemble chassis of varying widths. Each of the rods has a threaded hole located radially in each end which receives a screw that fits into a corresponding hole or slot in the side plates. When the rods are in place against the side plates and the screws are tightened, a rigid three-dimensional frame is formed.

The electronic circuit modules are comprised of the printed circuit board on which the circuit components, including switches, indicator lights and connectors are mounted, a front panel with cutouts for the lights or switches and a back panel with cutouts for the connectors. The front panel and the back panel are mounted perpendicularly on the ends of the printed circuit boards with the lights and connectors protruding through at appropriate locations. The indicator lights and switches and the connectors (with some exceptions) are connected only to the printed circuit boards so that the front and rear panels can be easily removed for service access to the module circuitry.

Each printed circuit board has four slots. Each slot, in turn, engages one of the four rods. To assemble the unit the modules are laid on two of the rods with two of the slots engaging the rods and the remaining pair of rods is placed over the modules to capture them so that the modules are rigidly locked together to form a unit. When the modules are placed side-by-side on the rods special contacts ground the module printed circuit board to the rods to insure ground continuity. The module front panels and back panels align to form the front and rear faces of the chassis. The front and back panels of each module may illustratively be painted or treated to give the chassis a finished appearance.

The chassis is completed by removable top and bottom panels which are held by clips onto the rods. When placed onto the rods side-by-side, the panels form the top and bottom of the package. In addition, the clips serve to electrically connect the panels to the rods to insure that the panels are grounded to provide electrical shielding to the circuit modules. The panels are provided in widths matching the widths of the various modules.

Power and ground and data signals are conveyed between the modules by means of an internal cable which connects the modules in parallel so that only connections with external circuitry need be made through the back panel connectors.

BRIEF DESCRIPTION OF THE DRAWING

FIG. 6 is a detail of the grounding contact used on the module printed circuit boards to connect the boards to a frame rod.

FIG. 7 is a detail of the edge of the module printed circuit board showing the slotted connection to the module front (or rear) panel allowing the front or rear panels to be easily removed from the printed circuit boards.

FIG. 8 is a detail of a blank panel which may be used to fill an empty space in the chassis if the chassis is not filled with circuit modules.

FIG. 9 shows an illustrative metal floater panel which is used to physically position and protect and electrically shield circuit modules in a chassis which is not filled with circuit modules.

DETAILED DESCRIPTION OF THE PREFERRED EMBODIMENT

Figure 1:
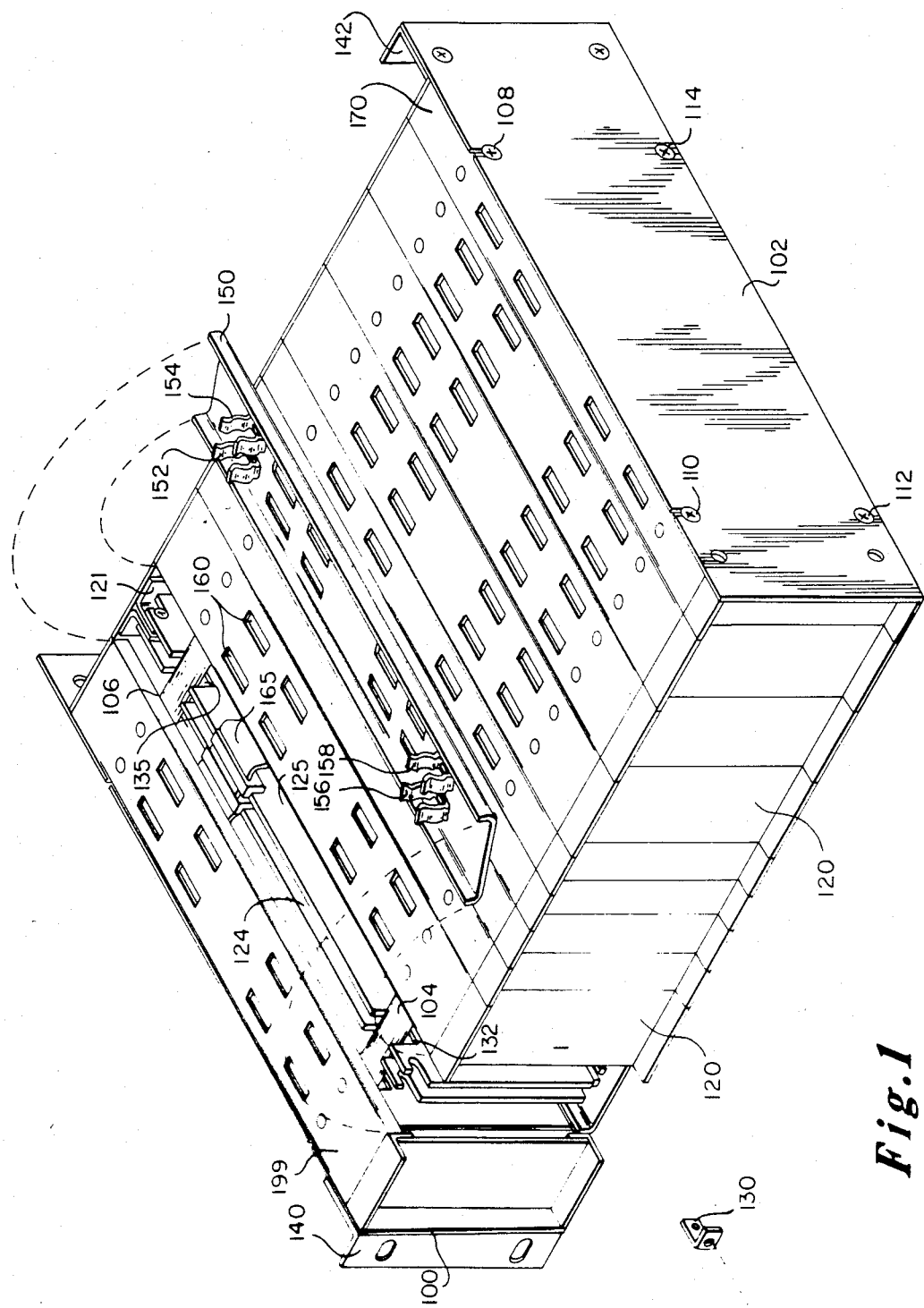
FIG. 1 of the drawing is perspective view of the complete chassis assembly with one of the clip-on top covers removed and with a front panel removed to show an illustrative construction.
Figure 5:
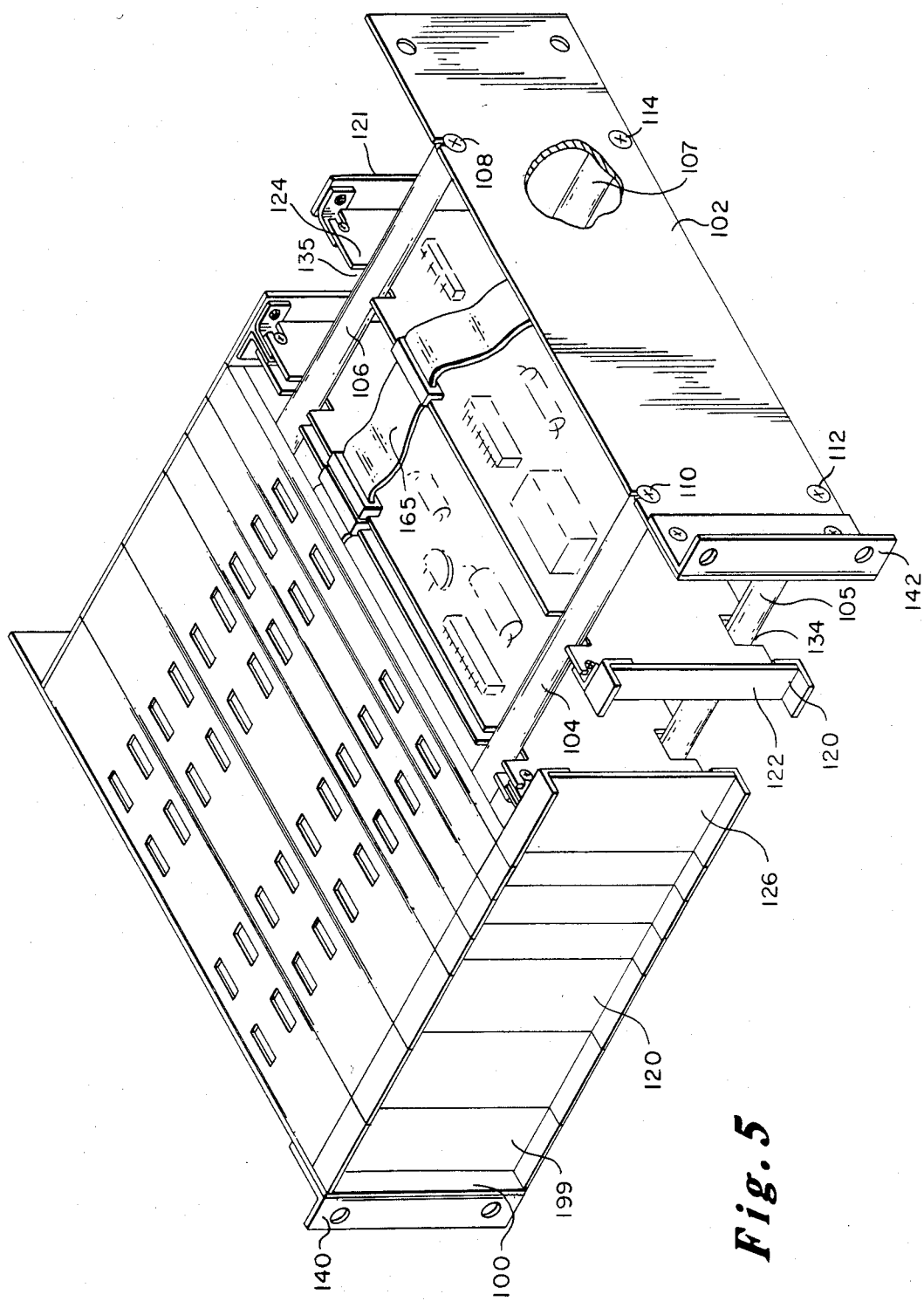
FIG. 5 shows a perspective view of a chassis with some of the top and bottom panels removed showing the frame support rods, one and two-board modules and the internal bus connecting the modules.

The basic structure of the chassis assembly is shown in FIGS. 1 and 5 and consists of side plates 100 and 102 and four electrically conductive support frame rods 104–107. Side plates 100 and 102 may be identical or mirror images and may be fabricated in various sizes to accommodate different module sizes. A typical size is fifteen inches long by five and a quarter inches wide.

Side plates 100 and 102 are held in parallel planar relationship and rigidly separated by four support rods 104–107. These rods may be comprised of steel, nickel-plated brass or other suitable electrically conductive material and may have various shaped cross-sections. As with side plates 100 and 102, rods 104–107 may be fabricated in different lengths to assemble chassis of different widths. In the embodiment shown, each of the rods has a tapped hole in each end to receive a screw for locking the chassis assembly together. However, rods can be provided with a tapped hole in one end and a threaded stud in the other or with threaded studs in both ends. In this manner rods of a few standard lengths may be screwed together to form a composite rod of many lengths. Although flat or round head screws may be used, screws with countersunk heads are preferred.

Each of side panels 100 and 102 are provided with two slots such as slots 108 and 110 which receive the screws in the ends of the rods 104 and 106 and two holes such as holes 112 and 114 which receive the screws in the end of rods 105 and 107. Although different shaped slots may be used, preferably each of these slots consists of a slot of sufficient width to pass the shaft of the screw, ending in a conical depression into which the head of a countersunk screw screw fits. The holes are countersunk for receiving the heads of the screws. Thus, when the rods are in place and the screws are tightened the panels are locked against the rods to form a rigid three-dimensional frame.

A plurality of modular circuit packages 120 can be placed down on rods 105 and 107 between side plates 100 and 102 and captured by rods 104 and 106 to form the complete chassis assembly. Each of these modules consists of a front panel 122 and a back panel 121 which are attached to one or more printed circuit boards, such as board 124, on which the electrical components are mounted. A module may have one printed circuit board such as module 120 in FIG. 5 or it may have two or more printed circuit boards as in module 126 in FIG. 5. When two printed circuit boards are used, they are mounted "back-to-back" so that the electrical components face outwards and are easily reached for adjustment or repair.

The front panel 122 and back panel 121 are fastened to the printed circuit board 124 by means of angle brackets 130 and studs, screws or rivets. For example, a threaded stud may be pressed into front panel 122 and the surface ground to provide a smooth finish. The stud is then passed through brackets 123 and angle brackets 130 and fastened by a nut to complete the front panel assembly.

The front and back panel assemblies are not permanently attached to the printed circuit board, but are instead fastened to slots in the printed circuit board as shown in detail in FIG. 7. In particular, FIG. 7 shows bracket 730 fastened to angle bracket 723 (as previously mentioned in connection with a front panel assembly) by stud 794 and nut 795. Illustratively, bracket 730 is attached to board 724 by means of slot 791 and screw 790. A similar arrangement is used for attachment of board 724 to the back panel (not shown in FIG. 7). Screw 790 is in contact with the ground plane 785 of board 724 so that the front panel assembly is grounded to provide electrical shielding. When a module is comprised of two printed circuit boards care is taken to insure that each switch, indicator light or connector is electrically and mechanically connected to only one of the boards so that the front and back panels can be removed and the boards separated for repairs.

Each module printed circuit board 124 has four notches which engage the support rods. For example, member 124 has four notches 132, 134–136. Notches 132 and 135 engage support rods 104 and 106, respectively and notches 134 and 136 engage rods 105 and 107. These notches hold the circuit module firmly in position when the chassis assembly is completed. Each notch may be provided with a spring contact which engages the corresponding rod to electrically connect the ground plane on the printed circuit board to the rod to provide ground continuity. Specifically, referring to FIG. 6, board 624 is provided with contact 680. Contact 680 is staked and soldered to board 624 at point 686 in contact with the board ground plane 685 so that when a frame rod is placed in notch 632 contact 680 makes electrical contact with the rod and insures ground continuity.

In order to assemble the chassis, side covers 100 and 102 and the lower two support rods 105 and 107 are placed in position and screws are inserted through holes 112 and 114 and tightened to form a rigid U-shaped assembly. The module assemblies are then laid in place, side by side, down on the lower rods 105 and 107 with the notches in the lower side of the module printed circuit boards engaging rods 105 and 107. Rods 104 and 106 are then fitted into the slots in side plates 100 and 102 and the screws tightened to capture the modules. Advantageously, the module printed circuit boards are held in a vertical position by the side plates and rods to provide for cooling by forced or natural air flow over the components.

Side plates 100 and 102 are arranged so that the forward ends of the plates extend forward of the front panels and align with brackets 123 on the front plates of the modules to give a boxed or framed face to the chassis which has a pleasing appearance. In addition, side plates 100 and 102 extend out beyond the back panels on either side of the chassis to protect the connectors protruding throught the back panels.

The chassis unit can be provided with rubber feet for table top use or ears 140 and 142 can be used to mount the unit in a rack. For shipping or storage the ears are mounted with screws on the back of the unit (such as ear 142, FIG. 1). For mounting the ears are removed from the back of the unit and refastened on the front of the side plates (such as ear 140, FIG. 1).

The entire width of the chassis may be filled with circuit modules, but in some cases, a chassis assembly may not be filled with modules, leaving an empty space. In order to hold the circuit modules aligned and to provide mechanical protection and electrical shielding, a floater panel such as panel 903 (FIG. 9) is used. Panel 903 has four spring clips 953, 954 and 957, 959 which grip rods 904–907 and hold plate 903 in a vertical position against the end module 922. Clips 953, 954 and 957, 959 also electrically connect panel 903 (which may be electrically conductive) to the rods for electrical shielding purposes. Panel 903 has two holes along its bottom edge for rods 105 and 107 and two slots along its top edge to accomodate rods 104 and 106. In order to use panel 903, it is slid onto rods 105 and 107 before the rods are fastened to side plates 100 and 102.

If desired for appearance purposes or for cooling airflow purposes the spaces 990 and 991 at the front and rear of the assembly may be filled by blank panels such as panel 870 shown in FIG. 8. Panel 870 is attached to two standoffs 866 and 868 by screws 872 and 874. Standoffs 866 and 868 are in turn attached to clips 852 and 856 which grip the frame support rods and fasten the panel in place.

At this point, the top and bottom of the chassis assembly may be completed by means of top and bottom covers such as cover 150. Cover 150 is a sheet metal strip bent into the shape of an elongated "U". Fastened to the inner side of cover 150 are four clips, 152–158. These clips engage rods 104–107 to hold the cover firmly in place and to provide electrical contact between the cover and the support rods in order to ground the covers for electrical shielding purposes. The covers may be provided with slots, such as slots 160, in order to provide for access to components needing adjustment and to assist in cooling by forced or natural airflow through the module or the covers may be left blank. The bottom of the chassis may be completed by similar covers.

The covers may be provided in several different widths, of which two are shown. One width, such as width 150, is used to cover a circuit module with two printed circuit boards. Narrower widths, such as panel 170, may be provided for circuit modules having only one printed circuit board. For the smaller widths only two clips are necessary to hold the cover onto the frame support rods.

After the top and bottom covers are in place, access can easily be gained to the electronic circuits for adjustment by simply prying up and removing an appropriate one of covers 150. In order to remove a module for repair or to rearrange the module order, the screws holding the upper frame support rods (rods 104 and 106) to the side plates can be loosened and the support rods with the attached covers clipped thereto lifted off the side covers to expose and release the modules. Since the covers remain clipped to the support rods, the entire cover assembly can be easily handled as a unit. The modules and the bottom covers remain held in position by the lower support rods 105 and 107 and side plates 100 and 102.

Figure 2:
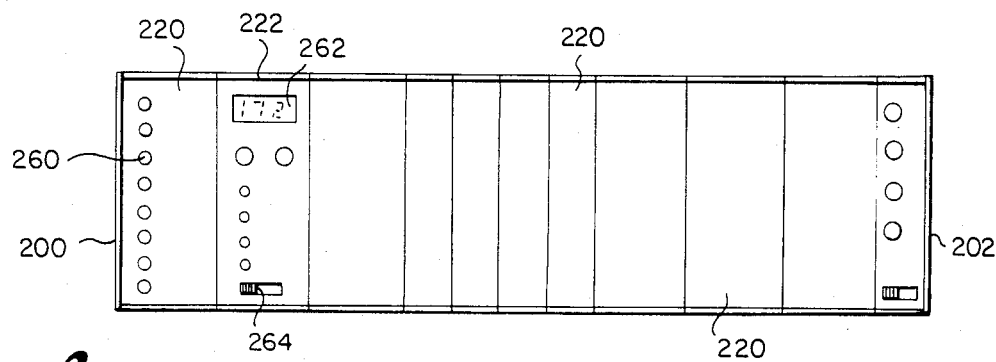
FIG. 2 of the drawing shows a front view of the completed chassis schematically showing the front panels of each module with an illustrative arrangement of indicator lights and switches.

FIG. 2 of the drawing shows a front view of the assembled chassis. The circuit module front panels 220 are lined up side-by-side to produce a composite front panel which has a pleasing and finished appearance. As previously mentioned, the front panels may be provided with cutouts for indicator lights, such as lights 260, or readouts and switches, such as 262 and 264.

Figure 3:
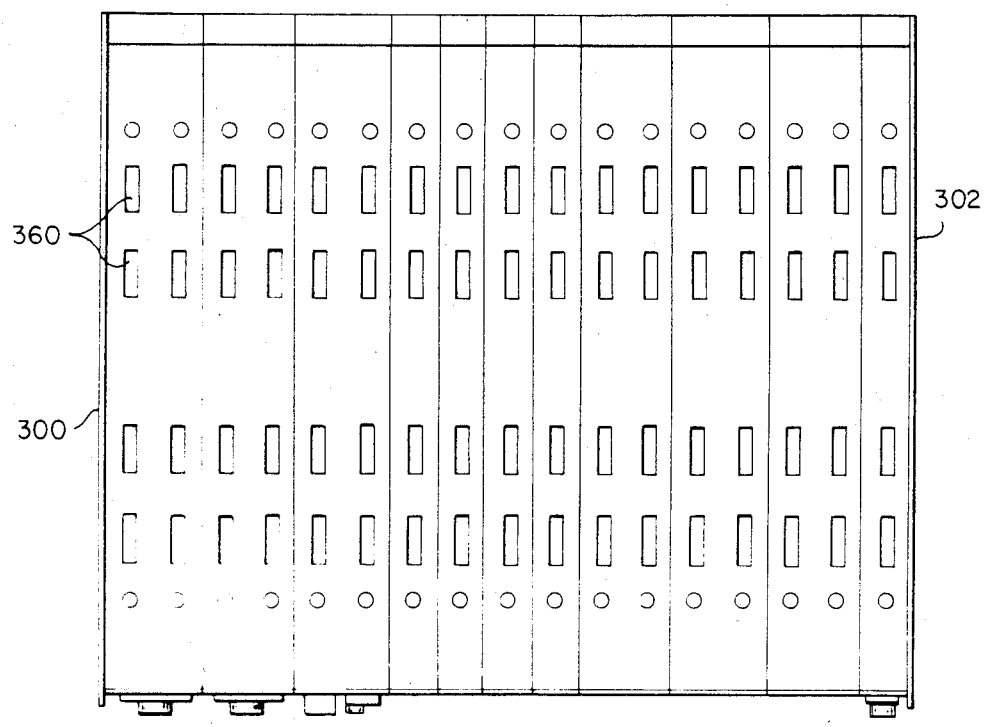
FIG. 3 of the drawing shows a bottom view of the completed chassis showing the alignment of the bottom panels.

FIG. 3 of the drawing shows a top view of the assembled chassis illustrating an array of top covers with slots 360 provided for access or ventilation.

Figure 4:
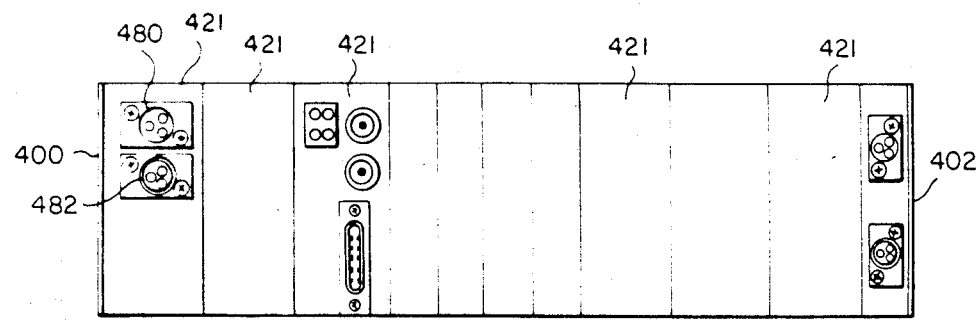
FIG. 4 shows a back view of the completed chassis showing an illustrative arrangement of the external connectors.

FIG. 4 of the drawing shows a back view of the chassis assembly with the circuit module back panels 421 arranged side-by-side to form a composite back panel. Some, or all, of the back panels may be provided with cutouts for connectors which are mounted on the module printed circuit boards and protrude through holes in the back panels. Alternatively the connectors can be mounted on the back panels themselves (such as connectors 480 and 482). The connectors allow for connection between the circuit modules and external circuitry. Since the connectors are for external connections only and do not have to mate with a fixed pattern of connectors on a backplane or motherboard, any pattern of connectors can be used.

In accordance with the invention, internal electrical connections between the circuit modules in the chassis assembly are made by using ribbon cables that pass through slots in the edges of the module printed circuit boards. Ribbon cable 165 is connected in parallel to all the modules and provides power and ground connections from a power supply module (such as module 199) to the rest of the modules. Cable 165 may also provide internal data signals between the modules in the system and is provided with standard ribbon cable connectors which plug into sockets fastened to each module printed circuit board. The printed circuit boards in a two-board module may also be connected together by means of a separate ribbon cable (not shown) passing through another slot between the boards.

What is claimed is:

1. An electronic chassis assembly comprising,
a first planar side plate,
a second planar side plate,
a plurality of frame support rods attached perpendicularly to the planes of said side plates and extending between said first and said second side plates to hold said side plates in spaced parallel relationship, at least one circuit module, comprising at least one planar circuit board for mounting electronic circuits thereon, said board having notches therein removably engaging said support rods and holding said board between said first and second side plates perpendicularly to said frame support rods, a front panel attached perpendicularly to one end of said board, a back panel attached perpendicularly to the other end of said board, said front and back panels forming the front and back faces of said chassis assembly, and means enclosing the top and bottom of said chassis assembly.

2. An electronic chassis assembly according to claim 1 wherein said plurality of frame support rods comprises a first frame support rod being attached near one edge of said first side plate and being attached near a corresponding edge of said second side plate and a second frame support rod being attached near an edge of said first side plate physically opposite said one edge and being attached near an edge of said second side plate located physically opposite said corresponding edge of said second plate.

3. An electronic chassis assembly according to claim 2 wherein said board has at least two notches therein, said notches being located substantially opposite each other across the width of said board.

4. An electronic chassis assembly according to claim 3 wherein said enclosing means comprises at least one cover and means removably attaching said cover to said frame support rods.

5. An electronic chassis assembly according to claim 4 wherein said attaching means comprises a plurality of clips removably engaging said frame support rods.

6. An electronic chassis assembly according to claim 5 further comprising means for electrically connecting said circuit module to power and ground and to external circuitry.

7. An electronic chassis assembly according to claim 6 wherein said chassis is comprised of a plurality of circuit modules, said front and back panels of each of said plurality of modules aligning to form the front and back faces of said chassis.

8. An electronic chassis assembly according to claim 7 wherein said means for connecting said circuit modules to power and ground comprises a flexible ribbon cable connected in parallel to each of said plurality of circuit modules.

9. An electronic chassis assembly according to claim 8 wherein each of said circuit module boards has an additional notch therein and said ribbon cable passes through said notch from board to board.

10. An electronic chassis assembly according to claim 8 wherein said means for connecting said circuit modules to external circuitry comprises at least one connector mounted on said board and passing through said back panel.

11. An electronic chassis assembly comprising, a first planar side plate, a second planar side plate, four frame support rods, two of said frame support rods being attached perpendicularly to the plane of said first side plate, being spaced along one edge of said first side plate and further being attached perpendicularly to the plane of said second side plate and being spaced along a corresponding one edge of said second side plate; two of said frame support rods being attached perpendicularly to the plane of said first side plate and being spaced along a second edge of said first side plate physically opposite to said one edge and further being attached perpendicularly to the plane of said second side plate and being spaced along a corresponding second edge of said second side plate physically opposite to said corresponding one edge of said second side plate, said rods holding said side plates in spaced parallel relationship, a plurality of circuit modules, each of said circuit modules comprising at least one planar circuit board for mounting electronic circuits thereon, said board having four notches therein, two of said notches being located along a first edge of said board and two of said notches being located along a second edge of said board opposite said first board edge, said notches removably engaging said support rods in order to hold said board between said first and second side plates, a front panel attached perpendicularly to one end of said board, and a back panel attached perpendicularly to the other end of said board, said front panel and said back panel on each of said modules holding said module perpendicularly to said frame support rods and spacing said module from other modules when said modules are placed side-by-side on said frame support rods.

12. An electronic chassis assembly according to claim 11 further comprising means enclosing the top and bottom of said circuit module assembly.

13. An electronic chassis assembly according to claim 12 wherein said enclosing means comprises a plurality of covers, each of said covers being substantially the width of one of said modules and means attaching said covers to said frame support rods.

14. An electronic chassis assembly according to claim 13 wherein said attaching means comprises a plurality of clips removably engaging said frame support rods.

15. An electronic chassis assembly according to claim 14 wherein said first side plate and said second side plate have at least two slots and two holes therein and said frame support rods have tapped holes in each end thereof so that said rods are attached perpendicularly to said side plates by means of screws threaded into said rods and engaging said slots and said holes.

16. An electronic chassis assembly according to claim 15 wherein said frame support rods are each comprised of a plurality of standard length pieces and means attaching said rod pieces end-to-end.

17. An electronic chassis assembly according to claim 16 wherein said attaching means comprises threaded connectors.

18. An electronic chassis assembly according to claim 17 further comprising a flexible ribbon cable connected in parallel to each of said plurality of circuit modules for connecting said circuit modules to power and ground.

19. An electronic chassis assembly according to claim 18 wherein each of said circuit module boards has an additional notch in said first edge of said board and said ribbon cable passes through said additional notch from board to board.

20. An electronic chassis assembly according to claim 18 wherein said means for connecting said circuit modules to external circuitry comprises at least one connector mounted on said board and passing through said back panel.

21. An electronic chassis assembly comprising,
a first planar electrically conductive side plate,
a second planar electrically conductive side plate,
four electrically conductive frame support rods, a first pair of said frame support rods being attached perpendicularly to the plane of said first side plate, being spaced along one edge of said first side plate and further being attached perpendicularly to the plane of said second side plate and being spaced along a corresponding one edge of said second side plate and a second pair of said frame support rods being attached perpendicularly to the plane of said first side plate and being spaced along a second edge of said first side plate physically opposite to said one edge and further being attached perpendicularly to the plane of said second side plate and being spaced along a corresponding second edge of said second side plate physically opposite to said corresponding one edge of said second side plate, said rods holding said side plates in spaced parallel relationship,
a plurality of circuit modules, each of said circuit modules comprising
 at least one planar circuit board for mounting electronic circuits thereon, said board having a ground plane thereon for grounding circuitry, and four notches therein, two of said notches being located along a first edge of said board and two of said notches being located along a second edge of said board opposite said first board edge, said notches removably engaging said support rods in order to hold said board between said first and second side plates,
 a front panel attached perpendicularly to one end of said board, and
 a back panel attached perpendicularly to the other end of said board, said front panel and said back panel on each of said modules holding said module perpendicularly to said frame support rods and spacing said module from other modules with said modules placed side-by-side on said frame support rods and said front and back panels of each of said plurality of modules aligning to form the front and back faces of said chassis,
 means electrically connecting said front panel and said back panel to said board ground plane,
 means electrically connecting said board ground plane to each of said frame support rods,
a plurality of covers, each of said covers being substantially the width of one of said modules,
 a plurality of clips removably engaging said frame support rods to electrically connect said covers to said frame support rods, and
 a flexible ribbon cable connected in parallel to each of said plurality of circuit modules for connecting said circuit modules to power and ground.

22. An electronic chassis assembly according to claim 21 wherein each of said circuit module boards has an additional notch in said first edge of said board and said ribbon cable passes through said additional notch from board to board.

23. An electronic chassis assembly according to claim 22 wherein said first side plate and said second side plate have at least two slots and two holes therein and said frame support rods have tapped holes in each end thereof so that said rods are attached perpendicularly to said side plates by means of screws threaded into said rods and engaging said slots and said holes and wherein said first pair of rods engage said slots so that said first pair of rods can be removed without removing said screws.

24. An electronic chassis assembly according to claim 23 wherein at least one of said modules is comprised of two circuit boards having electronic components mounted on one side of each of said boards and said boards are each attached to said front panel and said back panel in a physical relationship so that the sides of said boards having components mounted thereon face outwards.

25. An electronic chassis assembly according to claim 24 wherein said frame support rods are each comprised of a plurality of standard length pieces and means removably attaching said rod pieces end-to-end.

26. An electronic chassis assembly according to claim 25 wherein said attaching means comprises threaded connectors.

27. An electronic chassis assembly according to claim 26 wherein said means for connecting said circuit modules to external circuitry comprises at least one connector mounted on said board and passing through said back panel.

28. An electronic chassis assembly according to claim 26 further comprising a floater panel for use in said chassis assembly when said assembly is not entirely filled with circuit modules, said floater panel comprising an electrically conductive planar panel having two holes and two slots therein removably engaging said frame support rods.

29. An electronic chassis assembly according to claim 26 further comprising a blank panel for filling holes in said front and back faces of said chassis assembly when said assembly is not entirely filled with circuit modules, said blank panel comprising an rectangular panel, a plurality of standoffs attached perpendicularly to said rectangular panel and means removably attaching said standoffs to said frame support rods.

* * * * *